US009395110B2

(12) United States Patent
Savelli et al.

(10) Patent No.: US 9,395,110 B2
(45) Date of Patent: Jul. 19, 2016

(54) SECURE THERMOELECTRIC DEVICE

(71) Applicant: COMMISSARIAT A L'ENERGIE ATOMIQUE ET AUX ENERGIES ALTERNATIVES, Paris (FR)

(72) Inventors: Guillaume Savelli, Grenoble (FR); Philippe Coronel, Barraux (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 256 days.

(21) Appl. No.: 14/351,416

(22) PCT Filed: Oct. 9, 2012

(86) PCT No.: PCT/FR2012/000406
§ 371 (c)(1),
(2) Date: Apr. 11, 2014

(87) PCT Pub. No.: WO2013/054009
PCT Pub. Date: Apr. 18, 2013

(65) Prior Publication Data
US 2014/0260334 A1    Sep. 18, 2014

(30) Foreign Application Priority Data

Oct. 12, 2011   (FR) ...................................... 11 03111

(51) Int. Cl.
*H01L 35/32*        (2006.01)
*F25B 21/02*        (2006.01)
(Continued)

(52) U.S. Cl.
CPC ................ *F25B 21/02* (2013.01); *H01L 35/06* (2013.01); *H01L 35/32* (2013.01); *H01L 35/325* (2013.01); *H01L 35/04* (2013.01)

(58) Field of Classification Search
CPC ......... H01L 35/04; H01L 35/06; H01L 35/32; H01L 35/325; F25B 21/02
USPC ....................................... 337/16, 83, 103, 125
See application file for complete search history.

(56) References Cited

U.S. PATENT DOCUMENTS 3,377,206 A  *  4/1968  Emeis ...................... H01L 35/06
                                                                136/212
3,496,028 A  *  2/1970  Hampl, Jr. ............... H01L 35/06
                                                                136/211
(Continued)

FOREIGN PATENT DOCUMENTS

EP            0 935 297 A1      8/1999
JP         A-2004-221409        8/2004

*Primary Examiner* — Anatoly Vortman
*Assistant Examiner* — Jacob Crum
(74) *Attorney, Agent, or Firm* — Oliff PLC

(57) ABSTRACT

The device includes a thermoelectric module provided with a thermocouple. Said thermocouple includes a first and second leg which are made of different thermoelectric materials, electrically connected by a connecting element configured to deform according to the temperature thereof so as to assume: a first deformation position in which the first and second legs are electrically connected in series solely by means of the connecting element; and a second deformation position in which the connecting element is in electrical contact with a shunt contact pad of the device, said shunt contact pad being made of a material, the electrical conductivity of which is greater than the electric conductivity of the connecting element and of the first and second legs. The device also includes a load, the electrical resistance of which is lower than the electrical resistance of the thermoelectric module, said load being electrically connected to the shunt contact pad.

13 Claims, 3 Drawing Sheets

(51) Int. Cl.
   *H01L 35/06*   (2006.01)
   *H01L 35/04*   (2006.01)

(56) References Cited

U.S. PATENT DOCUMENTS

| | | | |
|---|---|---|---|
| 5,609,032 A * | 3/1997 | Bielinski | F25B 21/02 136/204 |
| 6,911,891 B2 * | 6/2005 | Qiu | B81B 3/0051 337/16 |
| 2002/0097133 A1 * | 7/2002 | Charvet | H01H 1/0036 337/27 |
| 2010/0031987 A1 * | 2/2010 | Bell | H01L 23/3735 136/200 |
| 2011/0139206 A1 * | 6/2011 | Ukita | H01L 35/06 136/224 |

* cited by examiner

US 9,395,110 B2

SECURE THERMOELECTRIC DEVICE

BACKGROUND OF THE INVENTION

The invention relates to a device comprising a thermoelectric module provided with a thermocouple which comprises a first leg and a second leg made of different thermoelectric materials electrically connected by a connecting element.

STATE OF THE ART

Thermoelectric devices enable to use a physical phenomenon present in certain materials. This physical phenomenon is created by the relation between the heat flow which crosses these materials and the electric current that they conduct. A thermoelectric device generally comprises a plurality of thermocouples arranged thermally in parallel and electrically series-connected by metal connection elements. Each thermocouple comprises a pair of legs made of different thermoelectric materials. The legs of a thermocouple are interconnected at one of their ends by a junction element, thus forming a thermoelectric junction. The parallel thermal assembly may be achieved with hot and cold sides arranged on either side of the thermocouples respectively at the level of the thermoelectric junctions and of the thermocouple connection elements, or conversely.

A thermoelectric device may be used in Seebeck mode or in Peltier mode. In Seebeck mode, also called power generator mode, the device produces energy from a temperature gradient between the hot side and the cold side. In Peltier mode, also called cooling mode, the application of a current across the thermoelectric device enables to generate a temperature gradient between the hot side and the cold side.

Thermoelectric devices in cooling mode are widely used, particularly for the local cooling of electronic components. Generally, the efficiency of such thermoelectric devices depends on several parameters, particularly of the environment where they are used. Thus, according to initial thermal conditions, the variation of the cooling of the thermoelectric device according to the injected current has an optimum: when the intensity of the injected current exceeds this optimum, the Joule effect predominates over the Peltier effect, thus generating a less efficient cooling, which may even be a heating. In certain cases, the effect of the thermoelectric device on the electronic components may even reverse. In other words, the thermoelectric device generates a heating instead of a cooling, which may generate a deterioration of the components to be cooled as well as of the thermoelectric device.

SUMMARY OF THE INVENTION

There is a need to provide a device provided with a thermoelectric module having a limited deterioration.

This need tends to be fulfilled by the provision of a device comprising a thermoelectric module provided with a thermocouple, said thermocouple comprising a first leg and a second leg made of different thermoelectric materials electrically connected by a connecting element configured to deform according to its temperature so as to assume a first deformation position where the first and second legs are electrically series-connected solely by the connecting element, and a second deformation position where the connecting element is in electric contact with a shunt metal contact of said device. The shunt contact is made of a material having a greater electric conductivity than the connecting element and the first and second legs. The device also comprises a load electrically connected to the shunt contact. Said load has a smaller electric resistance than the thermoelectric module.

BRIEF DESCRIPTION OF THE DRAWINGS

The foregoing and other features and advantages of the present invention will more clearly appear from the following non-limiting description of specific embodiments of the invention, shown in the accompanying drawings, among which.

DESCRIPTION OF PREFERRED EMBODIMENTS

The device provided with a thermoelectric module described hereafter differs from prior art particularly in that it provides a security system which enables to avoid its deterioration and/or the deterioration of heat-sensitive devices located nearby.

Figure 1:
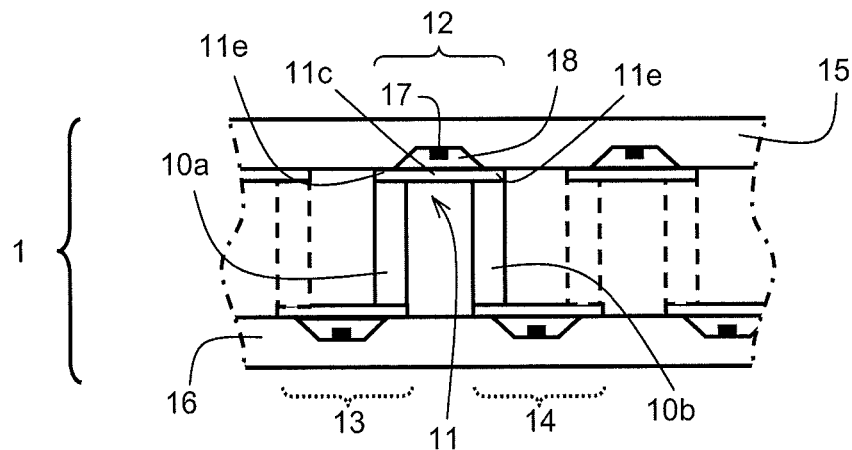
FIGS. 1 and 2 schematically illustrate in cross-section view a device according to a first embodiment of the invention.
Figure 2:
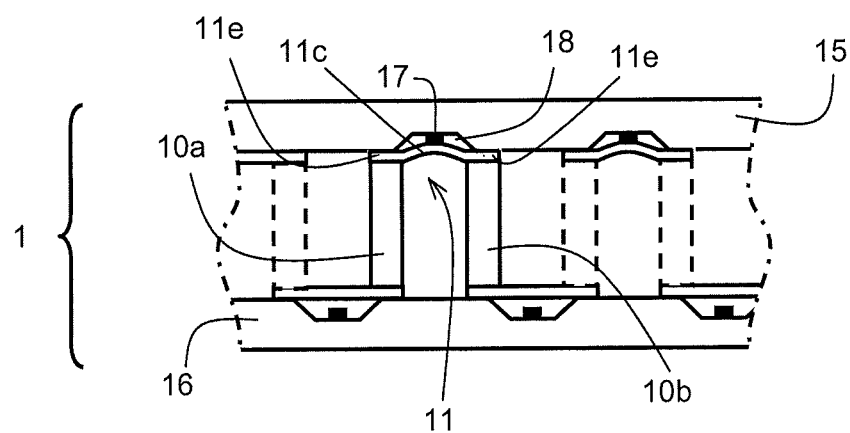

According to a specific embodiment illustrated in FIGS. 1 and 2, a device comprises a thermoelectric module 1 provided with a thermocouple 12. Thermoelectric module 1 comprises a first leg 10a and a second leg 10b made of different thermoelectric materials. Different thermoelectric materials means materials having different chemical compositions, capable of forming a thermocouple, or a same material having different doping types.

First and second legs 10a and 10b are electrically connected to each other, preferably at one of their ends, by a connecting element 11. First and second legs 10a and 10b may form thermocouple 12. Connecting element 11 then forms the junction element of thermocouple 12 (the thermoelectric junction). First and second legs 10a and 10b may also belong to two distinct thermocouples 13 and 14, electrically series-connected. In other words, connecting element 11 forms, in this case, an element of connection between two thermocouples. Advantageously, first and second legs 10a and 10b are arranged between first and second supports 15 and 16, respectively forming a reservoir on the cold side at a temperature $T_c$ and a reservoir on the hot side at a temperature $T_h$ higher than $T_c$. Hot and cold side reservoirs 15 and 16 are arranged on either side of the thermocouples of thermoelectric module 1, respectively at the level of the thermoelectric junction elements and of the thermocouple connection elements, or conversely.

First and second legs 10a and 10b may be based on silicon, bismuth telluride, silicon and germanium alloy, silicided materials, tellurium, oxides, or any other material enabling to form a thermocouple. Preferably, first and second legs 10a and 10b are doped with different doping types. First and second supports 15 and 16 may be based on silicon or any other material used as a support for usual thermoelectric devices.

As illustrated in FIG. 1, connecting element 11 comprises a central area 11c arranged between two ends 11e. Both ends 11e can be respectively interposed between the ends of first and second legs 10a and 10b and first support 15. Central area 11c of the connecting element is arranged opposite to a contact pad 17 for shunting the electric current flowing through thermoelectric module 1, particularly between first and second legs 10a and 10b. Shunt contact pad 17 of said device is advantageously arranged at the bottom of a cavity 18 formed in first support 15.

Connecting element 11 is advantageously configured to deform according to its temperature. According to the temperature of connecting element 11, the latter may assume a first deformation position according to which connecting element 11 is separated from shunt contact pad 17. Thus, first and second legs 10a and 10b are electrically series-connected solely by connection element 11.

As illustrated in FIG. 2, connecting element 11 is also configured to deform according to its temperature, to be able to assume a second deformation position where it is in contact with shunt contact pad 17 of said device.

Actually, under the influence of a variation of its temperature, connecting element 11 undergoes a structural deformation which brings it in electric contact with shunt contact pad 17. Preferably, connecting element 11 is configured and arranged so that ends 11e always remain attached between first and second legs 10a and 10b and first support 15 to avoid mechanical behavior issue at first and second legs 10a and 10b. Preferably, a bonding material, for example, based on titanium (Ti), may be interposed between connecting element 11 and first and second legs 10a and 10b. The bonding material thus enables to improve the contact between connecting element 11 and first and second legs 10a and 10b.

Shunt contact pad 17 is made of a material having a greater electric conductivity than connecting element 11 and first and second legs 10a and 10b. Shunt contact pad 17 may be based on a material selected from among metal, electrically-conductive polymers, electrically-conductive oxides, graphene, or also carbon nanotubes. Preferably, contact pad 17 may be based on Cu, Ag, Al, Au, polypyrrole, polyaniline, polyacetylene, poly p-phenylene sulfide, ZnO, In2O3, SnO2.

Figure 3:
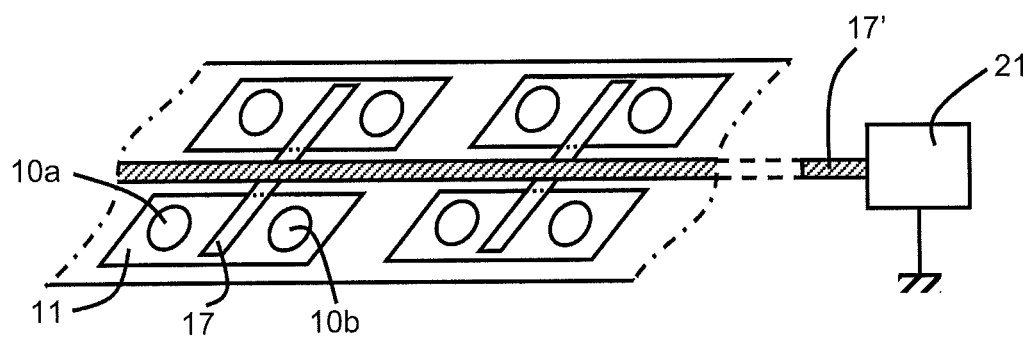
FIG. 3 schematically illustrates a top view of a device according to an embodiment of the present invention.

As illustrated in FIG. 3, shunt contact pad 17 is also electrically connected to a load 21 via a connection track 17' intended to convey an electric current to the load 21. Connection track 17' is preferably based on the same material as shunt contact pad 17. Load 21 does not belong to thermoelectric module 1 and has an electric resistance smaller than the electric resistance of thermoelectric module 1. Thus, the electric contact created between connecting element 11 and shunt contact pad 17 enables to divert the electric current usually flowing in thermoelectric module 1 towards load 21, which enables to deactivate thermocouple 12 in particular and thermoelectric module 1 in general. The diverted current may be dissipated in a resistor. It may also power an audio or luminous alarm signal, or also a feedback loop to stop thermoelectric module 1.

Thus, the deformation of connecting element 11 advantageously enables to stop the operation of thermoelectric module 1 when the temperature on cold side 15, that is, the temperature of connecting element 11, reaches a critical temperature. The fact of stopping the operation of thermoelectric module 1 enables to avoid deteriorating thermoelectric module 1 and the heat-sensitive devices located nearby.

Advantageously, connecting element 11 is reversibly deformable to switch from the first deformation position to the second deformation position when the temperature of connecting element 11 becomes higher than a first temperature $T_1$. The reversible deformation of connecting element 11 also generates a switching back from the second position to the first deformation position when its temperature becomes smaller than a second temperature $T_2$ smaller than or equal to first temperature $T_1$.

The materials, dimensions, and geometric shape of connecting element 11 are selected to adjust the temperature(s) for which connecting element 11 switches from the first to the second deformation position, and conversely. Thus, connecting element 11 may advantageously adapt to the different types of architectures and of thermoelectric devices.

Connecting element 11 may be formed based on a shape-memory alloy. This type of material allows a progressive deformation of connecting element 11 according to its temperature. A shape-memory alloy is a material capable of keeping the memory of an initial shape and of recovering this shape even after a deformation. Such a material can thus alternate between two shapes or deformation positions previously memorized when its temperature varies around a critical temperature.

Connecting element 11 preferably is a bistrip. Bistrip means a stack of at least two layers or two laminations made of different materials, soldered or glued to each other. The materials of the layers forming the bistrip have different thermal expansion coefficients. Thus, the bistrip can deform when its temperature varies.

The bistrip forming connection element 11 may be formed by using clean room micromanufacturing techniques. This type of bistrip is generally used in structures having micrometer-range thicknesses, from a few micrometers to a few millimeters. Bistrips formed according to these techniques advantageously comprise a silicon (Si) or silicon oxide (SiO2) layer. The material of an additional layer of the bistrip is selected to be compatible with micromanufacturing techniques, to be a good electric conductor, and to have the largest possible thermal expansion coefficient as compared with that of the Si or $SiO_2$ layer. Preferably, the additional layer of the bistrip is made of aluminum (Al), or gold (Au), or also of lead (Pb). These materials are widely used in clean rooms and have a thermal expansion coefficient which may be associated with a Si or $SiO_2$ layer. It is thus advantageous for connecting element 11 to comprise a silicon or silicon oxide layer and a layer of a material selected from among Al, Au, and Pb.

For bistrips at a macroscopic scale, having a thickness capable of exceeding a few millimeters, the different layers comprised in the bistrip are preferably cold-soldered. This type of bistrip advantageously comprises an Invar layer, a material corresponding to an iron (Fe) and nickel (Ni) alloy with different compositions. Invar is a metal alloy having a low thermal expansion coefficient, in the order of $0.5 \cdot 10^{-6}$ $K^{-1}$. It is also advantageous for the bistrip to comprise a layer enabling to have a significant difference between the thermal expansion coefficients of the bistrip layers. Indeed, the deformation is proportional to the difference between the thermal expansion coefficients of the materials of the layers of a bistrip, and thus, the larger this difference, the greater the bistrip deformation. Preferably, the bistrip comprises an additional iron-nickel-chromium, iron-nickel-cobalt, or iron-nickel-manganese layer. As an example, the thermal expansion coefficients of the Fe—Ni—Cr and Fe—Ni—Mn alloys respectively are in the order of $17.4 \cdot 10^{-6}$ $K^{-1}$ and $18.4 \cdot 10^{-6}$ $K^{-1}$, which is much higher than the thermal expansion coefficient of Invar.

According to a specific embodiment, thermoelectric module 1 of the device preferably comprises a plurality of thermocouples 12 electrically series-connected, each comprising first and second legs 10a and 10b made of different thermoelectric materials electrically connected by a connecting element 11.

In a first variation, connecting element 11 may be integrated in a device, according to the invention, provided with a thermoelectric module 1 configured in cooler mode. In certain conditions of use, the operation of thermoelectric module 1 may be altered so that it heats its environment instead of cooling it. Thus, the temperature of connecting element 11 increases until it assumes the second deformation position. This deformation position advantageously enables to stop the operation of thermoelectric module 1, thus avoiding the heating of its environment and the deterioration of thermoelectric module 1.

In a second variation, connecting element 11 may also be integrated in a device, according to the invention, provided with a thermoelectric module 1 configured in power generation mode. According to this configuration, thermoelectric module 1 generates an electric current flowing through first and second legs 10a and 10b. Such an electric current flow may generate a temperature increase of the module by Joule effect. The temperature increase of the module may be enhanced if the temperature of cold side 15 or of hot side 16 is high, thus causing a deterioration of thermoelectric module 1. It is then advantageous to use a connecting element 11 such as described hereabove to suspend the operation of thermoelectric module 1 when its temperature reaches a critical temperature.

In the case where thermoelectric module 1 comprises a plurality of series-connected thermocouples 12, the stopping of the operation of thermoelectric module 1 may be achieved by a single connection element 11 in the series by diverting the electric current towards load 21. However, the thermocouples of thermoelectric module 1 located upstream or downstream of connecting element 11 according to the invention may still conduct an electric current created by parasitic Seebeck effect, generated by the temperature gradient between cold side 15 and hot side 16. This electric current may by itself deteriorate thermocouples 12 located upstream or downstream of connecting element 11, according to the invention, and generate an unwanted heating by Joule effect.

To overcome such unwanted phenomena, it is advantageous to use connecting elements such as described hereabove instead of all the junction elements and all the connecting elements of thermoelectric module 1. In other words, each thermocouple 12 is associated with a shunt contact pad 17 and each connection element 11 of thermoelectric module 1 is configured to deform according to its temperature to assume one of the first and second deformation positions. In the first deformation position, the first and second legs of a same pair (10a, 10b) are electrically series-connected by connecting element 11. In the second deformation position, connecting element 11 is in electric contact with a shunt contact pad 17 made of a material of greater electric conductivity than connection element 11 and the first and second legs of the same pair (10a, 10b). Each shunt contact pad 17 of thermoelectric module 1 is electrically connected to a load 21 having a lower electric resistance than thermoelectric module 1.

Figure 4:
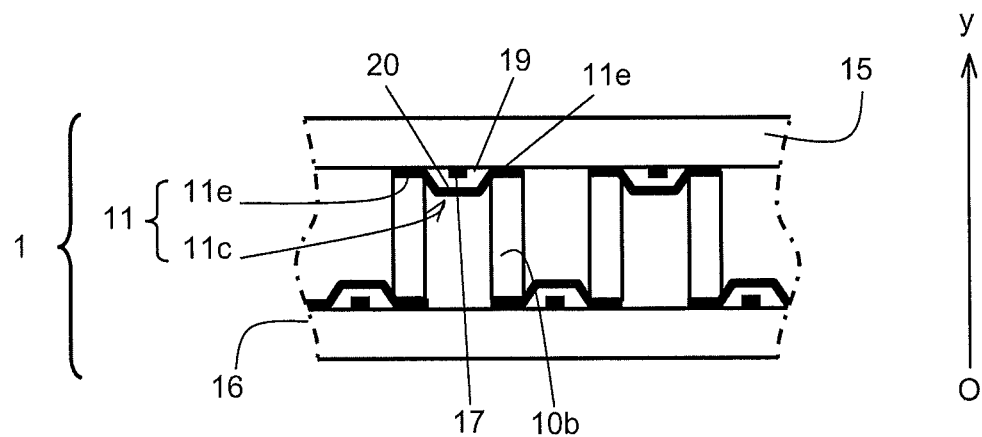
FIGS. 4 and 5 schematically illustrate in cross-section view a device according to another embodiment of the invention.
Figure 5:
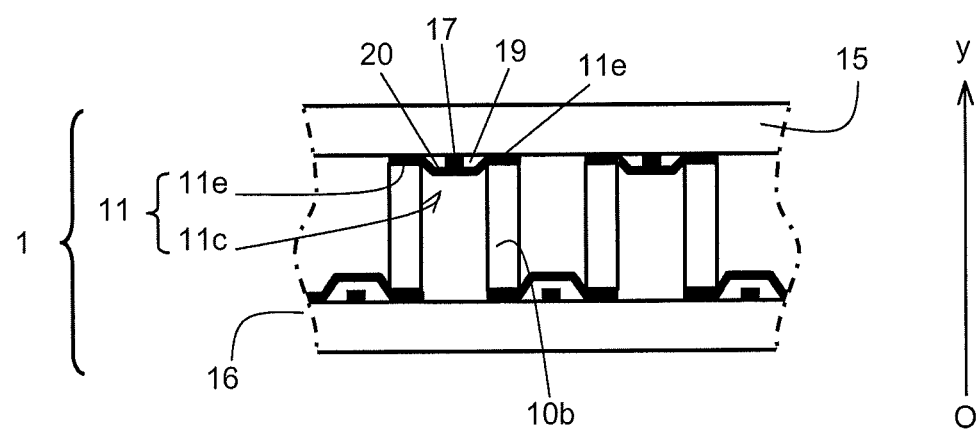

According to a second embodiment illustrated in FIGS. 4 and 5, the connecting element between the legs of different thermoelectric materials is a blistering-type bistrip. Thermoelectric module 1 comprises elements similar to those illustrated in FIGS. 1 and 2 and designated with the same reference numerals. It particularly comprises first and second legs 10a and 10b, arranged between two supports 15 and 16. Supports 15 and 16 are respectively associated with a hot side and with a cold side, or conversely. According to this embodiment, supports 15 and 16 may have no cavities 18. One then has shunt contact pads 17 arranged on the surfaces opposite to supports 15 and 16. First and second legs 10a and 10b are interconnected at one of their ends by a connection element 11, which is a blistering-type bistrip.

Blistering-type bistrip means a bistrip where the switching between two deformation positions according to its temperature is performed by deflection of an elastic "blistering" curvature. According to its temperature, connecting element 11 "blisters" and comes into contact with shunt contact pad 17. "Blistering" means that the curvature of a shape which is concave along a predetermined direction undergoes a deflection so that the curvature becomes convex along said direction.

The materials, dimensions, and geometric shape of the blistering bistrip are selected to set the temperature(s) of the switching from the first deformation position to the second deformation position, and conversely. A blistering bistrip is generally formed by a pressing intended to form the curvature. The shape of this curvature as well as the pressing force particularly enable to adjust the switching temperatures of the blistering bistrip. This type of bistrip advantageously enables to release the constraints regarding the selection of the materials and the bistrip dimensions. Thereby, according to the architecture and to the type of thermoelectric module 1, connecting element 11 may be integrated and adapted by adjusting the characteristics of the curvature of the blistering bistrip.

As illustrated in FIG. 4, connecting element 11 comprises a concave curvature along axis (oy) forming a cavity 19 provided with a bottom 20. The space delimited by cavity 19 and support 15 comprises shunt contact pad 17. Bottom 20 of cavity 19 is separated from shunt contact pad 17, thus defining a first deformation position where first and second legs 10a and 10b are electrically series-connected only by connecting element 11.

As illustrated in FIG. 5, according to its temperature, connecting element 11 switches from the first deformation position to a second deformation position where bottom 20 is in contact with shunt contact pad 17. Shunt contact pad 17 is made of a material having a greater electric conductivity than connecting element 11 and first and second legs 10a and 10b. Shunt contact pad 17 is also electrically connected to a load 21 (not shown in FIGS. 4 and 5) via a connection track 17' intended to convey an electric current to load 21. Connection track 17' is preferably based on the same material as shunt contact pad 17. Load 21 has a lower electric resistance than thermoelectric module 1. Thus, the electric contact created between connecting element 11 and shunt contact pad 17 enables to deviate the electric current to load 21, which enables to deactivate thermocouple 12 in particular and thermoelectric module 1 in general.

As illustrated in FIG. 5, shunt contact pad 17 is arranged so that it stops the travel of connecting element 11 during its "blistering", thus enabling to create an electric contact between connecting element 11 and shunt contact pad 17 and the deviation of the electric current usually flowing between first and second legs 10a and 10b via connecting element 11.

Preferably, connecting element 11 comprises a central area 11c arranged between two ends 11e interposed between the ends of first and second legs 10a and 10b and support 15. Central area 11c of connecting element 11 has the shape of a concave curvature along axis (oy) to form cavity 19. Connecting element 11 is preferably configured and arranged so that ends 11e always remain fixed between first and second legs 10a and 10b and support 15. Only central portion 11c blisters, which enables to avoid mechanical behavior issues at the level of first and second legs 10a and 10b.

The contact between connecting element 11 and shunt contact pad 17 may also be achieved after the total "blistering" of connecting element 11. In other words, cavity 19 reverses so that connecting element 11 is in contact with shunt contact pad 17. Reversal of cavity 19 means that the curvature forming cavity 19 passes from a concave curvature to a convex curvature along axis (oy), or conversely.

The invention claimed is:

1. A device comprising a thermoelectric module provided with a first leg and a second leg made of different thermoelectric materials electrically connected by a connecting element that deforms according to its temperature so as to assume:
   a first deformation position where the first and second legs are electrically series-connected solely by the connecting element;
   a second deformation position where the connecting element is in electric contact with a shunt contact pad of said device, said shunt contact pad being made of a material having a greater electric conductivity than the connecting element and the first and second legs;
   wherein the device comprises a load having a smaller electric resistance than the thermoelectric module, said load being electrically connected to the shunt contact pad.

2. The device according to claim 1, wherein the shunt contact pad is made of a material selected from among metals, electrically-conductive polymers, electrically-conductive oxides, graphene, and carbon nanotubes.

3. The device according to claim 1, wherein the connecting element is reversibly deformable to switch from the first position to the second deformation position when its temperature becomes greater than a first temperature $T_1$, and to switch back from the second position to the first deformation position when its temperature becomes lower than a second temperature $T_2$ smaller than or equal to first temperature $T_1$.

4. The device according to claim 1, wherein the connecting element is a bistrip.

5. The device according to claim 4, wherein the connecting element comprises an alloy of Fe and Ni.

6. The device according to claim 4, wherein the connecting element comprises an alloy of Fe, of Ni, and of an element selected from among Cr, Co, or Mn.

7. The device according to claim 4, wherein the connecting element comprises a silicon or silicon oxide layer.

8. The device according to claim 7, wherein the connecting element comprises a layer of a material selected from among Al, Au, Pb.

9. The device according to claim 4, wherein the bistrip is of blistering type.

10. The device according to claim 9, wherein the connecting element comprises a cavity having a bottom separated from the shunt contact pad when the connecting element assumes the first deformation position, the bottom being in contact with the shunt contact pad when the connecting element is in the second deformation position.

11. The device according to claim 9, wherein the connecting element comprises a cavity, and wherein the cavity reverses so that the connecting element is in contact with the shunt contact pad.

12. The device according to claim 1, wherein the connecting element is based on a shape-memory alloy.

13. The device according to claim 1, wherein:
   the thermoelectric module comprises a plurality of thermocouples electrically series-connected and each comprising first and second legs and made of different thermoelectric materials electrically connected by a connecting element;
   each thermocouple is associated with a shunt contact pad;
   each connecting element deforms according to its temperature to assume one of the first and second deformation positions; and
   each shunt contact pad is connected to the load.

* * * * *